United States Patent [19]
Zazzu

[11] Patent Number: 4,792,837
[45] Date of Patent: Dec. 20, 1988

[54] ORTHOGONAL BIPOLAR TRANSISTOR

[75] Inventor: Victor Zazzu, Montvale, N.J.

[73] Assignee: GE Solid State Patents, Inc., Somerville, N.J.

[21] Appl. No.: 833,074

[22] Filed: Feb. 26, 1986

[51] Int. Cl.$^4$ .................... H01L 29/72; H01L 27/12; H01L 29/04; H01L 29/06
[52] U.S. Cl. .......................... 357/35; 357/4; 357/59; 357/34; 357/56
[58] Field of Search ............... 357/4, 59 H, 59 K, 34, 357/35, 56

[56] References Cited

U.S. PATENT DOCUMENTS

| | | | |
|---|---|---|---|
| 3,246,214 | 4/1966 | Hugh | 357/35 |
| 3,943,555 | 3/1976 | Mueller et al. | 357/4 |
| 4,195,307 | 3/1980 | Jambotkar | 357/56 |
| 4,266,238 | 5/1981 | Nishizawa | 357/48 |
| 4,272,880 | 6/1981 | Pashley | 357/4 |
| 4,446,611 | 5/1984 | Bergeron | 29/578 |
| 4,532,534 | 7/1985 | Ford et al. | 357/23.4 |
| 4,583,106 | 4/1986 | Anantha et al. | 357/59 H |

FOREIGN PATENT DOCUMENTS

| | | | |
|---|---|---|---|
| 0045848 | 2/1982 | European Pat. Off. | 357/59 R |
| 0052038 | 5/1982 | European Pat. Off. | 357/35 |

Primary Examiner—Andrew J. James
Assistant Examiner—Jerome Jackson, Jr.
Attorney, Agent, or Firm—K. R. Glick; J. M. Trygg

[57] ABSTRACT

An orthogonal bipolar transistor structure is disclosed which is particularly suitable for formation in relatively thin epitaxial layers on insulating substrates. The emitter of the transistor is disposed directly over the base region while a collector region may be arranged on one side of or surrounding the base region. Alternatively, the collector region may be a pair of regions disposed laterally on opposite sides of the base region.

7 Claims, 3 Drawing Sheets

ORTHOGONAL BIPOLAR TRANSISTOR

The present invention relates to orthogonal bipolar transistor structures within an epitaxial layer on an insulating substrate.

BACKGROUND OF THE INVENTION

There has been substantial interest within the industry to develop integrated circuit devices having mixed bipolar and MOS technologies. The obvious advantage is the ability to perform both analog and digital functions on the same chip thereby enhancing and expanding potential applications of a single device.

Past efforts to achieve such structures fall into two categories, both of which utilize the epitaxial layer of a silicon-on-insulator (SOI) device as the active region containing the bipolar structure. The first category is a vertically arranged bipolar transistor wherein a base region is formed part way, but not completely, through the epitaxial layer and an emitter region is formed within this base region. The remaining epitaxial material which is around and beneath the base region serves as the collector. Examples of such structures will be found in U.S. Pat. No. 3,974,560 which issued Aug. 17, 1976 to Mueller et al. and U.S. Pat. No. 4,127,860 which issued Nov. 28, 1978 to Beilitz et al. A difficulty with this type of structure is that epitaxial layers are typically very thin, about 0.5 microns, with the region nearest the substrate having numerous defects. Necessarily, the base of the collector junction is formed in this defect region resulting in poor device performance. The second category is a laterally arranged bipolar transistor wherein the collector, base, and emitter are adjacent regions each of which is formed completely through the epitaxial layer. This structure provides the full thickness of the epitaxial layer to form the PN junctions and thereby avoids the difficulty mentioned above with respect to the first category of structure.

An example of this second category structure is disclosed in U.S. Pat. No. 4,050,965, which issued Sept. 27, 1977 to Ipri et al. Ipri discloses a lateral bipolar transistor formed in an epitaxial layer. P type dopants are implanted in what will ultimately become the emitter region adjacent one side of the gate. The P type dopants are diffused under the gate, a small amount thereby forming the base region. The collector and emitter regions are then implanted with N type dopants using the gate as a mask in the usual manner. This results in an N+ collector region adjacent one side of the gate, an N region under the gate, a narrow P type base region also under the gate, and an N+ type emitter region adjacent the other side of the gate. While this type of structure yields a transistor that is superior to the first category type transistor, it is difficult to control the width of the base region because it is dependent upon both the base and emitter diffusion parameters.

SUMMARY OF THE INVENTION

The present invention provides an orthogonal bipolar transistor structure in an integrated circuit device utilizing silicon-on-insulator technology. A first layer of single crystalline silicon is provided having a surface, a first region of a first conductivity type extending from the surface, and a second region of a second conductivity type, also extending from the surface. The second region is adjacent to, and in PN junction forming relation with the first region. A second layer of silicon of second conductivity type is disposed on the surface of the first layer and is arranged to form a PN junction with only the first region. This latter PN junction is spaced from the second region a specific distance.

DESCRIPTION OF THE PREFERRED EMBODIMENT

In the following description and as shown in FIGS. 1 through 6, specific P and N conductivity type materials and regions are indicated. These indications are by way of example and shall not be deemed to limit the teachings of the present invention. It will be understood that devices having opposite P and N arrangements are considered equivalent in all pertinent respects to the devices described herein.

Figure 1:
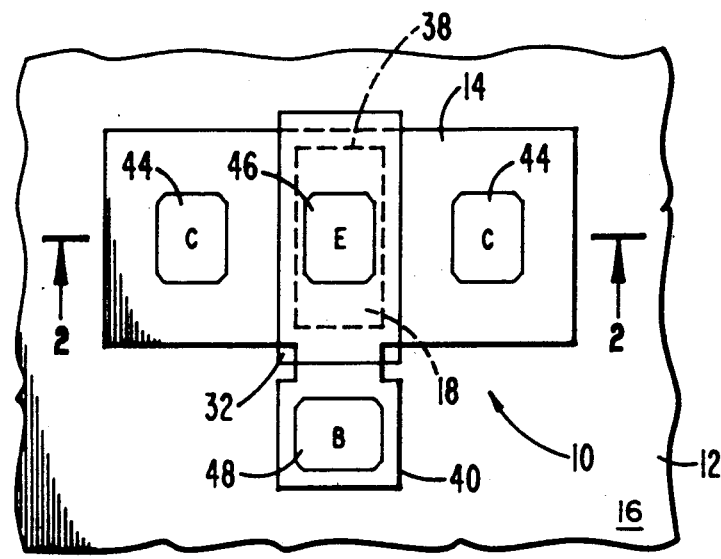
FIG. 1 is a plan view of a portion of a semiconductor device showing an active region containing an orthogonal bipolar transistor in accordance with the teachings of the present invention.
Figure 2:
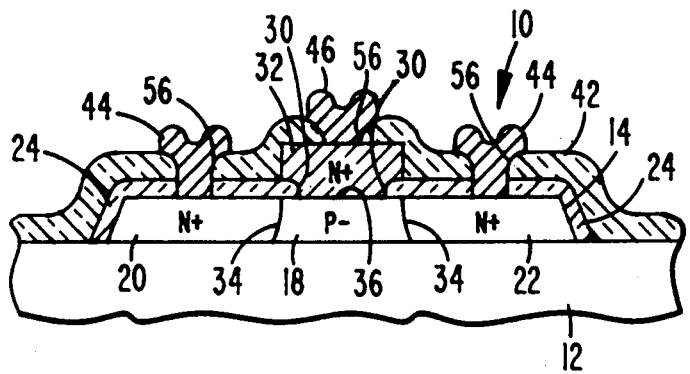
FIG. 2 is a cross-sectional view taken along the lines 2—2 in FIG. 1 showing the device.

There is shown in FIGS. 1 and 2 an orthogonal bipolar transistor device 10. The device 10 includes an insulating substrate 12, such as sapphire, and an epitaxial layer of single crystalline silicon which defines an island or active region 14 on a major surface 16 of the substrate 12. The island 14 includes a central first region 18 of P type conductivity which is the base region of the transistor and second and third regions 20 and 22 of N type conductivity which, in the present example, are disposed on opposite sides of the first region 16 and constitute the collector of the transistor. The second and third regions 20 and 22 are electrically connected together by means of metalization, not shown, thereby forming a single collector. A thin insulating layer 24 of silicon oxide is disposed over the island 14 and includes an aperture 30 which extends through the layer 24 to expose a portion of the surface of the island 14. A layer 32 of polycrystalline silicon which, in the present example is doped N type conductivity, is disposed over the insulating layer 24, extending through the aperture 30 and into PN junction forming relation with the first region 18. The layer 32, which is the emitter of the transistor, is best seen in FIG. 2. The second and third regions 20 and 22 form the PN junctions 34 with the first region 18 while the layer 32 forms the PN junction 36 therewith. The layer 24 of silicon oxide extends completely over the regions 20 and 22 overlapping the PN junctions 34 as shown in FIG. 2 so that the entire PN junction 36 is contained within the dashed line indicated as 38 in FIG. 1. This overlap by the insulating layer 24 assures that the N doped polysilicon layer 32 does not short out against the second or third regions 20 and 22.

Figure 3:
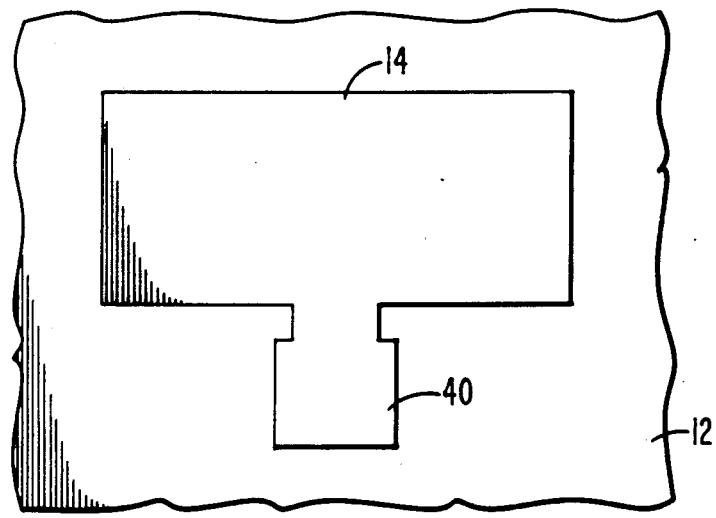
FIG. 3 is a plan view of the epitaxial layer of the device shown in FIG. 1.

The island 14 includes a portion 40 which extends from one side thereof, as best seen in FIG. 3. The portion 40 is of P type conductivity and is an extension of the first region 18. While the layer 32 of polycrystalline silicon extends over the first region 18, it does not extend over the portion 40, as is shown in FIG. 1. A layer 42 of insulating material, such as phosphate silicate glass (PSG) is disposed over the device 10. Electrical contact is made to the two collector regions 20 and 22, the emitter 32, and the base region 18 by the metal contacts 44, 46, and 48, respectively.

Figure 4:
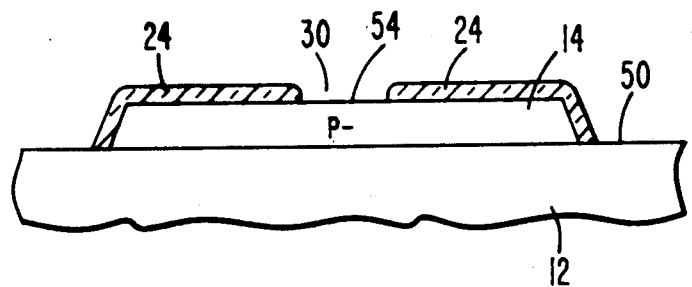
FIGS. 4, 5, and 6 are views similar to that of FIG. 2 showing the device in various stages of completion.

One method of making the orthogonal bipolar transistor device 10, shown in FIGS. 1 and 2 is illustrated in FIGS. 3, 4, 5, and 6. FIG. 3 illustrates the substrate 12 which may be any suitable insulator, such as sapphire, upon which a layer of single crystalline silicon may be formed. An epitaxial layer of single crystalline silicon is formed on a major surface 50 of the substrate 12 and an island or active region 14 defined in the epitaxial layer by etching away portions of the layer surrounding the island in the usual manner, thereby exposing the surface 50. The island 14 includes the portion 40 as best seen in FIG. 3. As shown in FIG. 4, a relatively thin insulating layer 24 of silicon oxide is formed on the island 14 by any suitable method, such as heating to a temperature of about 900° C. in an oxidizing environment. The layer 24 may be formed concurrently with the formation of a layer of gate oxide for MOS transistors being fabricated elsewhere on the substrate 12. An opening 30 is then etched through the layer 24 thereby exposing a portion of a surface 54 of the island 14.

Figure 5:
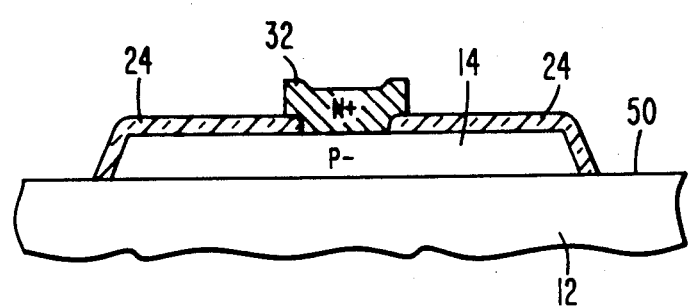

A highly doped N type layer 32 of polycrystalline silicon is then formed on the device 10 by low pressure chemical vapor deposition (LPCVD). The layer 32 is then defined by means of standard photolithographic techniques followed by a suitable etch to form the emitter region of the transistor 10 as shown in FIG. 5. The doping level of the layer 32 should result in a resistance level of about 30 ohms per square. Note that the layer 32 fills the opening 30 and extends to the surface 54 of the island 14. It is important that the layer 32 overlap a small portion of the insulating layer 24 as shown in FIG. 5. While, in the present case, LPCVD was used to form the layer 32, any other suitable method may be used. Further, the layer 32 may be single crystalline silicon formed by utilizing epitaxial growth techniques that are well known in the art.

Figure 6:
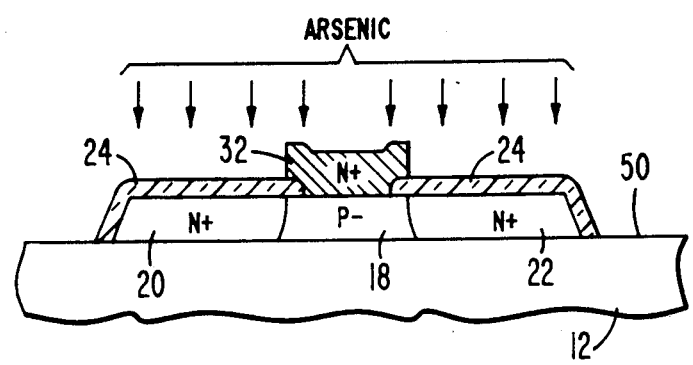

The device 10 is then subjected to an arsenic implantation through the layer 24 which forms the second and third regions 20 and 22 which are the collector regions of the transistor as shown in FIG. 6. The implantation energy should be about 80 to 90 kev which provides a surface concentration of about $10^{19}$ atoms cm$^{-3}$. Note that the portion of the island 14 that is directly under the layer 32, the first region 18 which is the base of the transistor, receives no N type impurities and therefore remains P- type. An important advantage of forming the base region 18 in this manner is that the base region is self-aligned with the emitter layer 32 and therefore their structural relationship can be controlled very precisely by controlling the thickness of the island 14 and the size of the opening 30.

A layer 42 of reflow glass, such as a phosphorous silicate glass or a boron phosphorous silicate glass, is deposited on the device 10. A photoresist layer, not shown, is then applied over the glass layer 42 and defined to have openings therethrough directly over the areas of the glass layer 42 where metal contacts are to be formed. The contact openings 56 are then etched through the glass layer 42 and underlying layer 24, if present, by any suitable etchant. After removing the photoresist, the glass layer 42 is then heat treated in the usual manner. A layer of conductive material, such as aluminum, is then deposited on the glass layer 42 and into the contact openings 56 thereby forming the contacts 44, 46, and 48. An interconnection pattern is then defined in the aluminum in the usual manner.

A very significant advantage of the present invention is that the thickness of the emitter of the transistor is independent of the thickness of the base region 18. This permits formation of a practical bipolar transistor on very thin epitaxial layers.

It will be understood by those skilled in the art that the collector regions 20 and 22 may take the form of a single collector region positioned on one side of the base region 18, or the collector region may take a toroidal, polygonal, or similar shape and surround the base region. Such structural alternatives are deemed to be within the spirit and scope of the claims set forth below.

Figure 7:
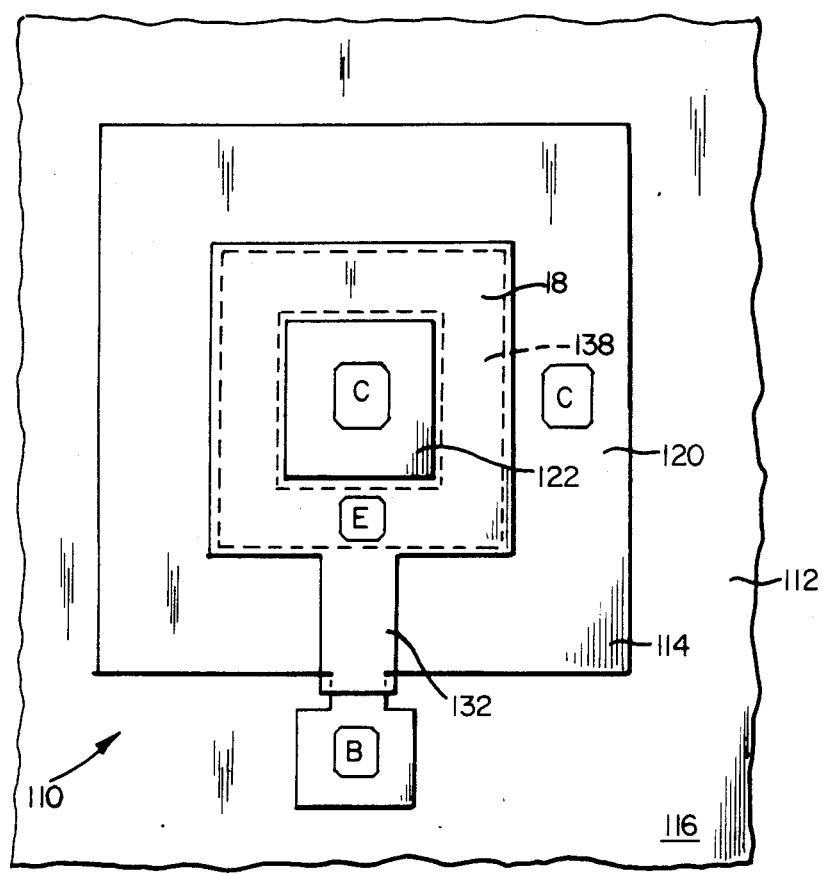

FIG. 7 illustrates an example of a device 110 having a polygonal collector region shape. The device 110 is analogous to the device 10 of FIGS. 1 and 2, and comprises an active island 114 disposed on a major surface 116 of an insulating substrate 112. The island 114 comprises a first layer of monocrystalline silicon that includes a first (base) region 118 of polygonal/toroidal shape, a second (collector) region 120 surrounding the first region 118, and a third (collector) region 122 surrounded by the second region 120. The first, second and third regions are contiguous with each other. A second layer 132 overlies the first layer and forms a PN junction contact area with the first region 118 at the surface of the first layer.

I claim

1. An orthogonal bipolar transistor comprising:
    (a) a thin first layer of single crystalline silicon having a substantially planar surface, a first region of a first conductivity type, extending from said surface, and a second region of a second conductivity type extending from said surface contiguous with said first region so as to form a PN junction that extends to said surface; and
    (b) a second layer of silicon of said second conductivity type on said surface and arranged to form a PN junction with only said first region, said PN junction being spaced from said second region
    (c) an emitter electrode contact to the second layer;
    (d) a base electrode contact to the first region of the first layer; and
    (e) a collector electrode contact to the second region of the first layer.

2. The transistor set forth in claim 1 including a layer of insulating material on said surface overlying said PN junction so as to insulate said second layer from said second region of said first layer.

3. The transistor set forth in claim 2 including an insulating substrate upon which said first layer is disposed.

4. The transistor set forth in claim 3 including a third region of said second conductivity type extending from said surface adjacent to and in PN junction forming relation with said first region and spaced from said second region, said second and third regions being electrically interconnected.

5. The transistor set forth in claim 4 wherein said second layer is a layer of polycrystalline silicon.

6. The transistor set forth in claim 4 wherein said second region surrounds said first region.

7. The transistor set forth in claim 6 wherein said second layer is a layer of polycrystalline silicon.

* * * * *